(12) United States Patent
Ichikawa

(10) Patent No.: US 7,888,850 B2
(45) Date of Patent: Feb. 15, 2011

(54) TUNING-FORK TYPE PIEZOELECTRIC UNIT

(75) Inventor: Ryoichi Ichikawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 56 days.

(21) Appl. No.: 12/011,507

(22) Filed: Jan. 28, 2008

(65) Prior Publication Data

US 2008/0179997 A1    Jul. 31, 2008

(30) Foreign Application Priority Data

Jan. 30, 2007   (JP)  .............................. 2007-018738
Jan. 18, 2008   (JP)  .............................. 2008-009143

(51) Int. Cl.
*H03H 9/21* (2006.01)

(52) U.S. Cl. .................. 310/370; 310/311; 331/156; 73/504.02

(58) Field of Classification Search .......... 310/370, 310/311; 331/156; 73/504.02
See application file for complete search history.

(56) References Cited

U.S. PATENT DOCUMENTS

| 6,041,495 A * | 3/2000 | Yoon et al. ............... 29/841 |
| 6,130,112 A * | 10/2000 | Kitano et al. ............... 438/108 |
| 2002/0011655 A1* | 1/2002 | Nishiyama et al. ......... 257/688 |
| 2004/0085163 A1* | 5/2004 | Kikushima ................. 333/200 |
| 2006/0131991 A1* | 6/2006 | Kawakami ................. 310/311 |

FOREIGN PATENT DOCUMENTS

| GB | 2 375 885 A | 11/2002 |
| JP | 2004-312057 | 11/2004 |
| JP | 2004 312057 A | 11/2004 |
| JP | 2006 311310 A | 11/2006 |

OTHER PUBLICATIONS

European Search Report dated Sep. 1, 2008.

\* cited by examiner

*Primary Examiner*—Thomas M Dougherty
*Assistant Examiner*—Bryan P Gordon
(74) *Attorney, Agent, or Firm*—Scott D. Wofsy; Edwards Angell Palmer & Dodge LLP

(57) ABSTRACT

An object is to provide a tuning-fork type piezoelectric unit in which as well as maintaining the vibration characteristics in the stationary condition when miniaturized, the bond strength is maintained, and also the frequency change for before and after a drop impact test is suppressed. The construction is such that in a tuning-fork type piezoelectric unit comprising; a container main body having a concave cross-section; an electrode pad which is provided inside a concavity of the container main body; a metal bump which is formed on the electrode pad; a tuning-fork type piezoelectric piece in which one principal plane of a tuning-fork base with a pair of tuning-fork arms extended therefrom is bonded to the metal pad by means of a conductive adhesive; and a cover which is joined to an opening end face of the container main body to hermetically seal the tuning-fork type piezoelectric piece, a surface area of an upper surface flat part of the metal bump is made smaller than a bottom surface area of the metal bump.

7 Claims, 6 Drawing Sheets

Length of metal bump upper surface flat part
(Percentage of length of upper surface flat part with respect to length of metal bump bottom surface)

TUNING-FORK TYPE PIEZOELECTRIC UNIT

CROSS-REFERENCE TO RELATED APPLICATIONS

This application claims priority under 35 U.S.C. §119(a)-(d) of Japanese patent application number JP2007-18738, filed Jan. 30, 2007 and Japanese patent application number JP2008-9143, filed Jan. 18, 2008.

BACKGROUND OF THE INVENTION

1. Technical Field

The present invention relates to a surface mounted tuning-fork type piezoelectric unit. In particular the invention relates to a tuning-fork type piezoelectric element, and a metal bump which connects to a container main body that accommodates the resonator.

2. Background of the Invention

A tuning-fork type piezoelectric unit is widely used as a clock frequency source of electronic equipment. In recent years, due to the miniaturization of the electronic equipment in which these are built-in, the size of the tuning-fork type piezoelectric unit is also required to be miniaturized and thinned.

Prior Art

FIG. 5A and FIG. 5B are drawings for describing a conventional tuning-fork type piezoelectric unit, wherein FIG. 5A is a perspective view of a tuning-fork type piezoelectric unit showing the interior opened with a part of the container main body removed, and FIG. 5B is a cross-sectional side view thereof on V-V (FIG. 5A). FIG. 6A and FIG. 6B are drawings for describing a tuning-fork type piezoelectric element, wherein FIG. 6A is a front view of the tuning-fork type piezoelectric element, and FIG. 6B is a schematic plan view showing the electrical connections of the tuning-fork type piezoelectric element.

The tuning-fork type piezoelectric unit, as shown in FIG. 5A and FIG. 5B comprises a container main body 1 with a tuning-fork type piezoelectric element 7 accommodated inside thereof, and is covered with a cover 2. The tuning-fork type piezoelectric element 7, is made for example from crystal, and as shown in FIG. 6A, a pair of tuning-fork arms 9 extend out from a tuning-fork a base 10. Moreover, it has excitation electrodes 9a on each of the four faces of the pair of tuning-fork arms 9, and lead out electrodes 10a extend out on one principal plane of the tuning-fork base 10 in a wiring pattern (not shown in the figure). The tuning-fork arms 9, as shown in FIG. 6B, are connected with common potentials between the two principal planes and the two side faces of the tuning-fork arms 9. Moreover, they are connected to the pair of lead out electrodes 10a provided on the one principal plane of the tuning-fork base 10.

The container main body 1 comprises a laminated ceramic substrate with a concave cross-section which has on an inside wall on one end side, for example a divided step 3. In this conventional example, it comprises a three layer structure comprising ceramic plates (1a, 1b, and 1c) in order from the open face. On an upper surface of this inside wall step 3 positioned on the container main body 1, electrode pads 4 are formed. The electrode pads 4 are formed with for example tungsten (W) as the ground electrode, and for example nickel (Ni) film as the intermediate material, and a conductive layer of gold (Au) film.

The ground electrode (W) is formed for example by printing and baking, and the intermediate material (Ni) and the conductive layer (Au) are formed by electroplating. Furthermore, on the upper surface of the electrode pad 4 there is formed a metal bump 6 comprising gold (Au). The metal bump 6 is formed by the aforementioned printing and baking, or by electroplating or the like. As required, the metal bump 6 may be formed by a print bump or a plating bump.

Furthermore, both end sides in the one principal plane of the tuning-fork base 10 with the lead out electrodes 10a extending from the excitation electrodes 9a are bonded to the metal bump 6 by a conductive adhesive 8. The conductive adhesive 8 is for example a heat hardening type, and after applying onto the metal bump 6, the tuning-fork base 10 is positioned. Then it is pressured (compressed) from above the tuning-fork base 10, and heat hardened. As a result, the lead out electrodes 10a extending from the excitation electrodes 9a of the pair of tuning-fork arms 9 are connected electrically to the mounting terminals 5 provided on the bottom face of the container main body 1, through the metal bump 6, the electrode pads 4, and a wiring path (not shown in the figures). The cover 2 is joined to the opening end face of the container main body 1 by a seam weld or the like, and the tuning-fork type piezoelectric piece 7 is hermetically sealed. Refer to Japanese Unexamined Patent Publication No. 2004-312057).

Problems With the Prior Art

However, in the tuning fork type piezoelectric unit of the above configuration, the metal bump 6 is formed in a flat shape, and hence at both end sides in the one principal plane of the tuning-fork base 10 with the extended lead out electrodes 10a, this is completely opposed and closely bonded. Consequently, the adhesive strength of the tuning-fork type piezoelectric piece 7 depends on the contact surface area which is closely contacted with the metal bump 6. On the other hand, regarding the tuning-fork type piezoelectric piece 7, in order to increase the adhesive strength of the conductive adhesive 8 with respect to external impact, and the electrical conductivity, it is desired to increase the contact surface area (facing surface area) with the metal bump 6. In this case, oscillation leakage from the tuning-fork base 10 of the tuning fork vibration due to the pair of tuning forks 9 becomes large in proportion to the contact surface area with the metal bump 6. Furthermore, the greater the oscillation leakage, the lower the oscillation efficiency of the tuning fork oscillation so that vibration characteristics in a stationary condition (a condition with no impact from the outside) where the crystal impedance (CI) is high are deteriorated. Moreover, even if the vibration characteristics in the stationary condition are maintained, with a larger the contact surface area, the amount of the conductive adhesive 8 between the tuning-fork base 10 and the metal bump 6 also increases, so that before and after the drop impact test, the change in the vibration frequency becomes great. That is to say, regarding the conductive adhesive 8, the condition changes due to a drop impact, and the retention state with respect to the tuning-fork base 10 changes. In this case, the bond strength is reduced due to the impact, so that the restraining force of the tuning-fork base 10 also weakens, and the vibration frequency is reduced. Furthermore, with a larger amount of the conductive adhesive 8, the retention condition also changes greatly, and hence the frequency change amount before and after a drop impact is also great. Due to these matters, the contact surface area where the flat shape metal bump 6 is closely contacted by means of the conductive adhesive 8 is severely limited to within a constant value. However, if the size of the tuning-fork type piezoelectric piece 7 becomes small, for example, if the length of the tuning-fork base 10 becomes somewhat less than 0.5 mm, with the thickness of the tuning-fork type piezo-electric piece 7 at 0.12 mm, the overall length 2.3 mm, and the width 0.5 mm, the positioning of the tuning-fork base 10 with respect to the metal bump 6 becomes difficult. Consequently, in the tuning-fork type piezoelectric unit with the metal bump 6 as a flat shape, then as well as the problem of maintaining the vibration characteristics in the stationary condition with the bond strength and the electrical conductivity maintained, there is a limit to suppressing the frequency change for before and after a drop impact.

Object of the Invention

An object of the present invention is to provide a tuning-fork type piezoelectric unit in which as well as maintaining the vibration characteristics in the stationary condition when miniaturized, the bond strength is maintained, and also the frequency change for before and after a drop impact is suppressed.

SUMMARY OF THE INVENTION

The present invention is constructed such that in a tuning-fork type piezoelectric unit comprising; a container main body having a concave cross-section; an electrode pad which is provided inside a concavity of the container main body; a metal bump which is formed on the electrode pad; a tuning-fork type piezoelectric piece in which one principal plane of a tuning-fork base with a pair of tuning-fork arms extended therefrom is bonded to the metal pad by means of a conductive adhesive; and a cover which is joined to an opening end face of the container main body to hermetically seal the tuning-fork type piezoelectric piece, a surface area of an upper surface flat part of the metal bump is made smaller than a bottom surface area of the metal bump.

In the tuning-fork type piezoelectric unit of the present invention, the metal bump has an inclined face or a stair shape on at least one end side. As a result, the construction is such that the surface area of the upper surface flat part is less than that of the bottom surface of the metal bump.

In the tuning-fork type piezoelectric unit of the present invention, the construction is such that the metal bump has an inclined face or a stair shape on both end sides in the width direction of the tuning-fork type piezoelectric piece.

The tuning-fork type piezoelectric unit of the present invention is constructed such that a length of the upper surface flat part of the metal bump viewed from the width direction of the tuning-fork type piezoelectric element is within a range from 20 to 90% of a length of a bottom surface of the metal bump.

Effects of the Invention

According to the tuning-fork type piezoelectric unit of the present invention, when the one principal plane of the tuning-fork base is pressed from above and bonded with a conductive adhesive, since the upper face flat part of the metal bump is less than the bottom surface area, the contact surface area which is held close by the conductive adhesive between the one principal plane of the tuning-fork base and the upper surface flat part can be made smaller than in the conventional example. Consequently, even if the adhesive condition is changed by an external impact, the influence from this can be minimized. As a result, the frequency change characteristics for before and after a drop impact are improved.

Furthermore, at the outside region of the upper surface flat part of the metal bump, there can be a gap between the tuning-fork base and the metal bump. Therefore, when the conductive adhesive is pressed, the tuning-fork base and the metal bump are bonded without being compressed. Consequently, the conductive adhesive at the outside region resiliently holds the tuning-fork base, and as mentioned in the embodiments, the bond strength for the amount that the upper surface flat part is reduced is supplemented, so that the bond strength can be maintained for the upper surface flat part.

Moreover, according to the present invention, since the upper surface flat part which is closely contacted is in the extension direction of the tuning-fork arm, then compared to the case where this is provided in the widthwise direction, hanging down of the tip side of the pair of tuning-fork arms is prevented.

Moreover, according to the present invention, the frequency change accompanying a drop test can be minimized.

BRIEF DESCRIPTION OF THE DRAWINGS

FIG. 1 is a diagram describing an embodiment of a tuning-fork type piezoelectric unit of the present invention, wherein

FIG. 3 is a diagram for describing an embodiment of a tuning-fork type piezoelectric unit of the present invention, wherein

FIG. 5 is a diagram for describing a conventional tuning-fork type piezoelectric unit, wherein

FIG. 6 is a diagram for describing a conventional tuning-fork type piezoelectric piece, wherein

DETAILED DESCRIPTION OF THE PREFERRED EMBODIMENTS

First Embodiment

Figure 1A:
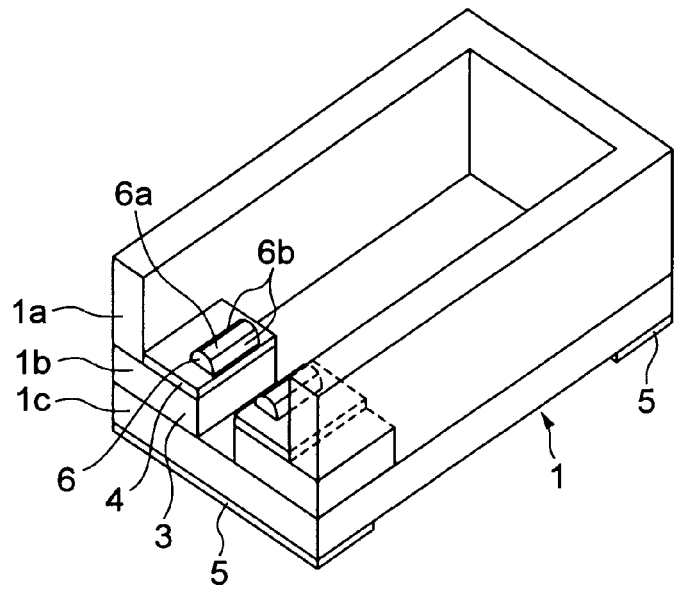
FIG. 1A is a perspective view where a part of a tuning-fork type piezoelectric unit is opened showing the interior thereof (tuning-fork type piezoelectric piece and cover are removed)
Figure 1B:
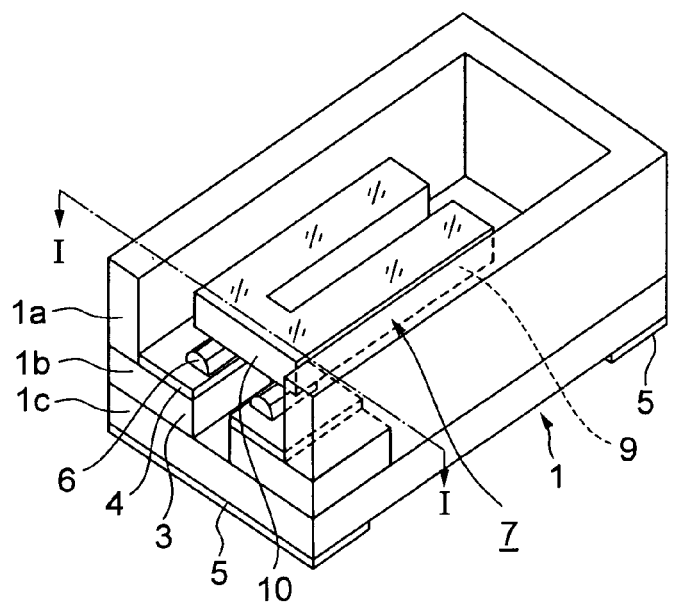
FIG. 1B is a perspective view where a part of a tuning-fork type piezoelectric unit with a tuning-fork type piezoelectric piece fitted is opened showing the interior thereof (cover is removed)
Figure 1C:
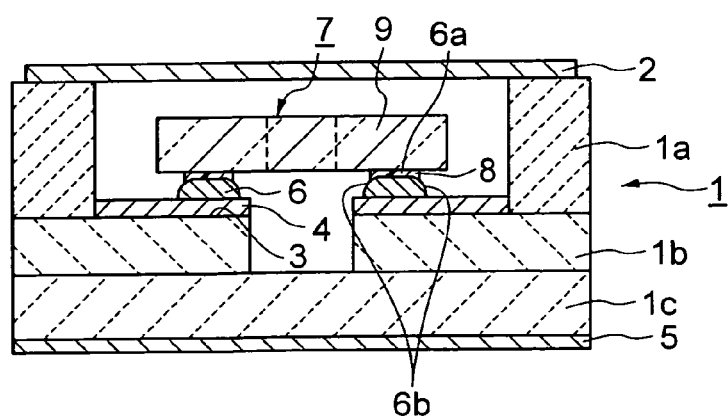
FIG. 1C is a cross-sectional side view along I-I (FIG. 1B) of a tuning-fork type piezoelectric unit.

FIG. 1A, FIG. 1B and FIG. 1C are diagrams of a tuning-fork type piezoelectric unit, for describing an embodiment of a tuning-fork type piezoelectric unit of the present invention, wherein FIG. 1A is a perspective view where a part of a tuning-fork type piezoelectric unit is opened showing the interior thereof (tuning-fork type piezoelectric element and cover are removed), FIG. 1B is a perspective view where a part of a tuning-fork type piezoelectric unit with a tuning-fork type piezoelectric piece bonded on a metal bump is opened showing the interior thereof (cover is removed), and FIG. 1C is a cross-sectional side view on I-I (FIG. 1B) of the tuning-fork type piezoelectric unit. Parts the same as in the previously described conventional example are denoted by the same reference symbols, and description thereof is simplified or omitted.

Figure 6A:
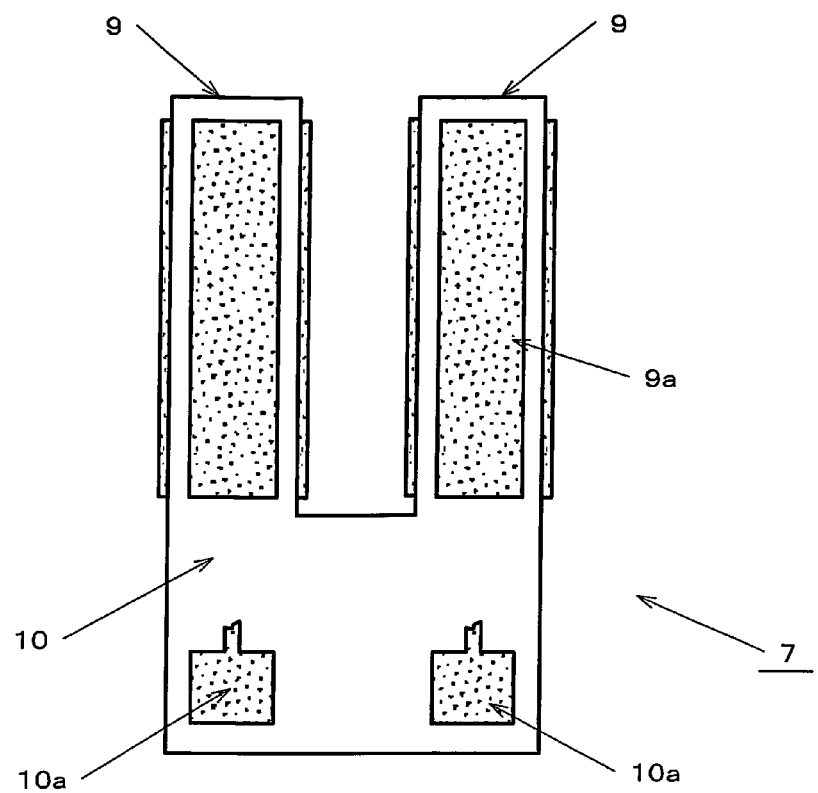
FIG. 6A is a front view.
Figure 6B:
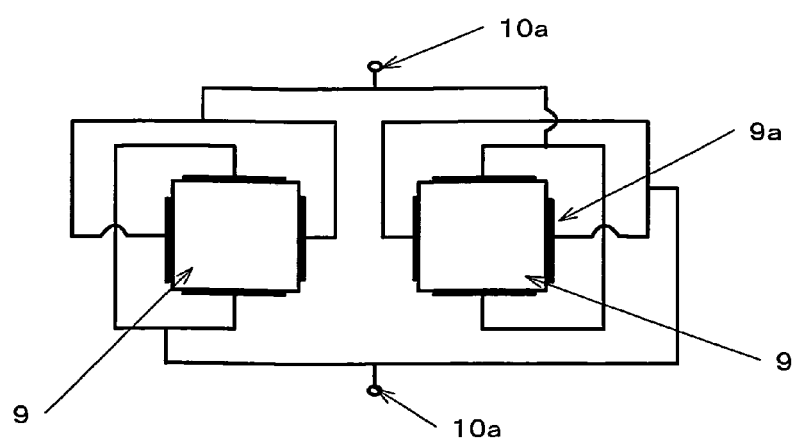
FIG. 6B is a schematic plan view showing the electrical connections.

The tuning-fork type piezoelectric unit of the present invention, similarly to that previously described, is constructed with the tuning-fork type piezoelectric piece 7 contained in the container main body 1 (ceramic plates 1a, 1b, 1c), and covered by the cover 2, so that the tuning-fork type piezoelectric piece 7 is hermetically sealed. Regarding the tuning-fork type piezoelectric piece 7, in this example also the piezoelectric member is a crystal. Furthermore, both end sides of one principal plane of the tuning-fork base 10 with the lead out electrodes 10a (See FIG. 6A) extended therefrom are bonded to the metal bump 6 on the electrode pad 4 provided on the inside wall step 3 on one end side of the container main body 1, by means of the conductive adhesive 8.

The electrode pads 4 comprises an earth electrode (tungsten W) formed by printing and baking, and an intermediate material (nickel Ni) and a conductive film (gold Au) formed by electroplating. The metal bump (Au) 6 comprises a printed bump or a plated bump. In this embodiment, a circular arc curved surface is formed on both end sides in the widthwise direction of the metal bump 6, and the central region becomes the upper surface flat part. Furthermore, the tuning-fork type piezoelectric piece 7 has a resonant frequency of for example 37.768 kHz, and the thickness of the tuning-fork type piezoelectric piece 7 is 0.12 mm, the overall length is 2.3 mm, and the width is 0.5 mm, and the length of the tuning-fork base 10 is 0.5 mm.

In the first embodiment, the thickness of the electrode pads 4 is for example around 20 µm, and regarding the metal bump 6, the longitudinal dimension in the lengthwise direction of the tuning-fork arm is 370 µm, the width dimension is 215 µm, and the thickness (height) dimension is 30 µm. The overall width dimension of the metal bump 6 that contacts with the one principal plane of the tuning-fork base 10 is 220 µm, the width dimension of the upper surface flat part is 100 µm, and the width dimension of the curved surface on both end sides is 60 µm.

According to this configuration, when the tuning-fork type piezoelectric piece 7 (the tuning-fork base 10) is bonded to the metal bump 6 by means of the conductive adhesive 8, since the width dimension of the upper surface flat part 6a of the metal bump 6 is narrow, the bond surface area where the metal bump 6 is in close contact is reduced. Consequently even if the bond condition changes due to external impact (drop impact test), the influence on the vibration characteristics is minimal, so that changes in the oscillation frequency can be suppressed. Furthermore, since the curved surface portion is provided on both end sides 6b of the upper surface flat part 6a so that the tuning-fork base 10 is retained, the bond strength of the tuning-fork type piezoelectric piece 7 can be maintained.

In brief, since the bond strength of the tuning-fork type piezoelectric piece 7 is maintained by the upper surface flat part 6a of the metal bump 6 and the curved surface on both end sides 6b, and furthermore, the upper surface flat part 6a bonded in close contact with the tuning-fork base 10 is narrow, frequency changes accompanying changes in the vibration characteristics for before and after a drop impact test are prevented. In other words, it can be said that the upper surface flat part 6a governs the bond strength and the vibration characteristics, and the curved surface on both end sides 6b supplements the bond strength. Consequently, reliably maintaining the tuning-fork type piezoelectric piece 7, and also reducing the frequency change at the time of a drop impact test can coexist.

Figure 2:
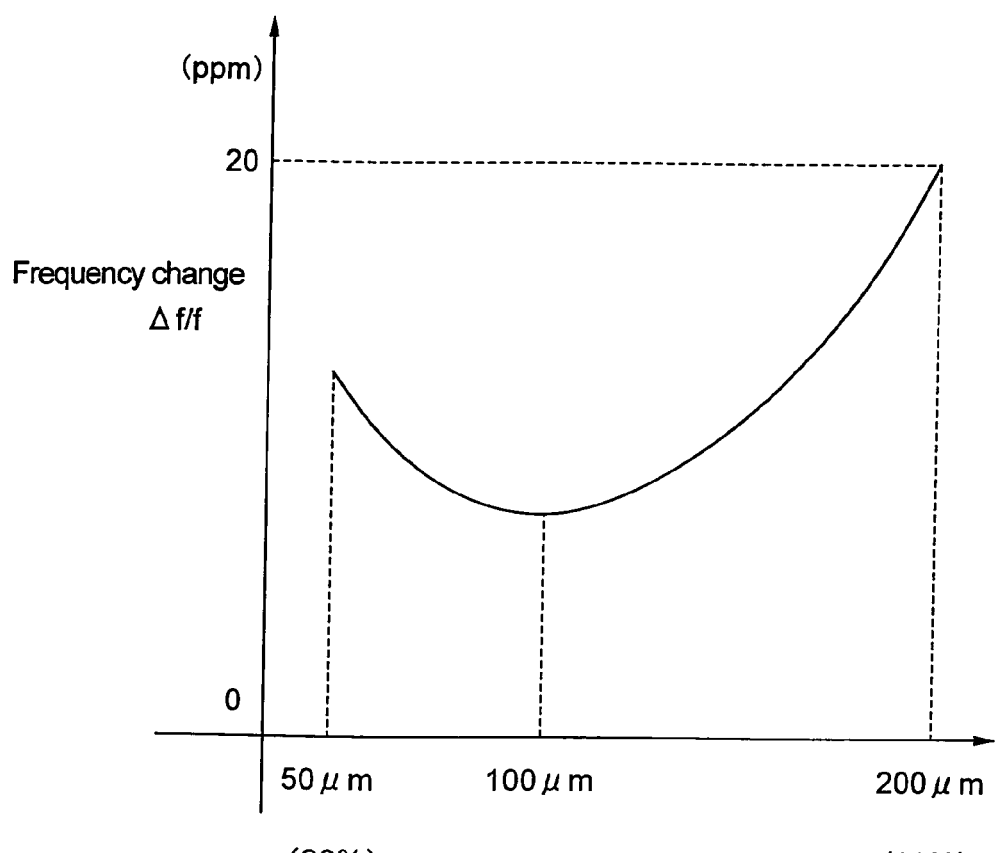
FIG. 2 is a frequency change characteristic diagram for before and after drop impact test, for explaining an operation of an embodiment of a tuning-fork type piezoelectric unit of the present invention.

FIG. 2 is a graph showing frequency change for before and after drop impact test, for when the length of the upper surface flat part 6a of the metal bump 6 is changed. Here regarding the drop impact test, when the tuning-fork type piezoelectric unit is dropped onto a concrete plate from 1.8 m above, there is a frequency difference $\Delta f/f$ for the oscillation frequency for before and after dropping. Here $\Delta f$ is the frequency difference (f-f) where the oscillation frequency before dropping is f, and the oscillation frequency after dropping is f. Furthermore, the tuning-fork type piezoelectric unit is mounted on a set base with a weight of 150 g and dropped.

As is clear from this graph, regarding the variation characteristic for the oscillation frequency for before and after a drop impact test with respect to the width dimension of the upper surface flat part 6a of the metal bump 6, when the width dimension of the upper surface flat part 6a is approximately 100 µm, the frequency change (deviation) becomes a parabolic curve with a minimum value of 8 ppm. Furthermore, with the width dimension of the upper surface flat part 6a within approximately 200 µpm, this becomes less than 20 ppm as a practical guide for the frequency change. However, when the width dimension of the upper surface flat part 6a is less than approximately 50 µm, drop impact test causes the tuning-fork type piezoelectric piece 7 to peel off from the metal bump 6 or become damaged. Furthermore, in any of the cases, since the $\Delta f/f$ is positive, then after a drop impact test the oscillation frequency is reduced. This frequency dependence on the width dimension of the upper surface flat part 6a of the metal bump 6, in particular the reason for having the minimum value, is inferred from the following. That is, when the contact surface area where the upper surface flat part 6a of the metal bump 6 is in close contact with the one principal plane of the tuning-fork base 10 (hereunder close contact surface area) is small, the rigidity is lost due to a drop impact test. Consequently, since the rigidity after a drop impact test is less than at the time of bonding before a drop impact test, the oscillation leakage which is proportional to the rigidity (bond strength) becomes small. Consequently, the extent of lowering of the oscillation frequency for before and after a drop impact test becomes large and the frequency change amount becomes large.

Next, if the degree of drop in the rigidity accompanying the increase in the close contact surface area due to the upper surface flat part 6a becomes small, the rigidity after a drop impact test becomes large approaching that at the time of bonding for before a drop impact test. Consequently, the oscillation leakage from the tuning-fork base 10 also becomes large approaching that at the time of bonding for before a drop impact test. Consequently, the degree of drop in the oscillation frequency for before and after a drop impact test becomes small, and the frequency change amount also becomes small.

Furthermore, if the close contact surface area is further increased, the degree of drop in the rigidity similarly decreases. However, if the close contact surface area becomes greater than a surface area for maintaining a constant rigidity (bond strength), the surplus part where the close contact surface area is increased, and the reduction in the rigidity due to a drop impact test, also become great so that the overall oscillation leakage becomes smaller than at the time of bonding for before a drop impact test. Consequently, the degree of drop in the oscillation frequency for before and after a drop impact test becomes large, and the frequency change amount becomes large. Due to these matters, regarding the oscillation frequency characteristics for before and after a drop impact test, it is inferred that this becomes a parabolic curve having a minimum value dependent on the rigidity and the close contact surface area of the conductive adhesive 8 due to the upper surface flat part 6*a*.

According to the above test results, at first, when the width dimension of the upper surface flat part 6*a* of the metal bump 6 is in the vicinity of 50 µm, the contact surface area with the tuning-fork base 10 is small. Consequently, at the time of the drop impact test, the impact is concentrated on the small bond surface area. Therefore the rigidity due to the conductive adhesive is reduced. Due to this, the frequency change for before and after a drop impact test becomes comparatively large (approximately 16 ppm).

Next, with the width dimension of the upper surface flat part 6*a* greater than 50 µm, the close contact surface area is increased, and the impact at the time of a drop impact test is dispersed. Therefore the degree of drop in the rigidity due to the conductive adhesive becomes small. Consequently, the frequency change for before and after a drop impact test becomes gradually smaller. Furthermore, with the width dimension of the upper surface flat part 6*a* in the vicinity of 100 µm, the rigidity due to the close contact surface area becomes a certain constant value, and the frequency change for before and after a drop impact test becomes a minimum (8 ppm).

Next the more that the width dimension of the upper surface flat part 6*a* exceeds the vicinity of 100 µm, it becomes greater than the surface area for maintaining the rigidity where the contact surface area becomes a certain constant value. Consequently, the rigidity drop for the surplus surface area amount as mentioned before, also increases so that the overall oscillation leakage due to a drop impact test becomes smaller than for at the time of bonding before a drop impact test, and it is inferred that the frequency change amount for before and after a drop impact test becomes great.

Due to these matters, regarding the width dimension of the upper surface flat part 6*a* of the metal bump 6, if the frequency change centered on a minimum of 100 µm is above 50 µm, being a value of a degree where peeling or damage does not occur, and is less than 200 µm being less than 20 ppm as a practical guide for the frequency change, the frequency change characteristics for before and after a drop impact test can be favorably maintained. Of course, other characteristics such as vibration characteristic of CI or the like can also be favorably maintained.

Furthermore, the width dimension of 50 µm to 200 µm of the upper surface flat part 6*a* of the metal bump 6 that favorably maintains the frequency change characteristics for before and after a drop impact test becomes 20 to 90% of the width dimension of the metal bump 6 (220 µm). Consequently, if the width of the upper surface flat part 6*a* is 20 to 90% of the width dimension of the metal bump 6, the frequency change characteristics can be well maintained for the frequency characteristics for before and after a drop impact test.

Second Embodiment

Figure 3A:
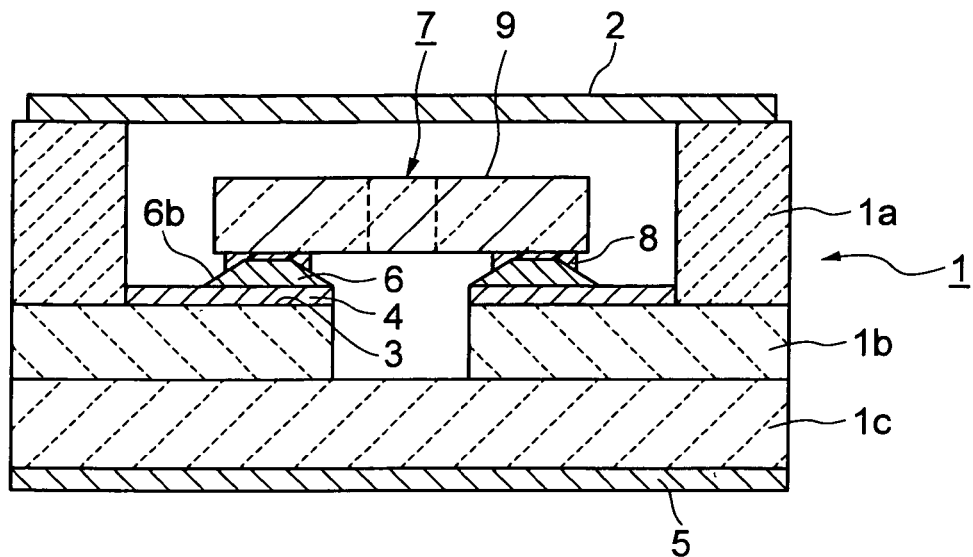
FIG. 3A is a cross-section view of a tuning-fork type piezoelectric unit which has a metal bump with an end face comprising an inclined face.
Figure 3B:
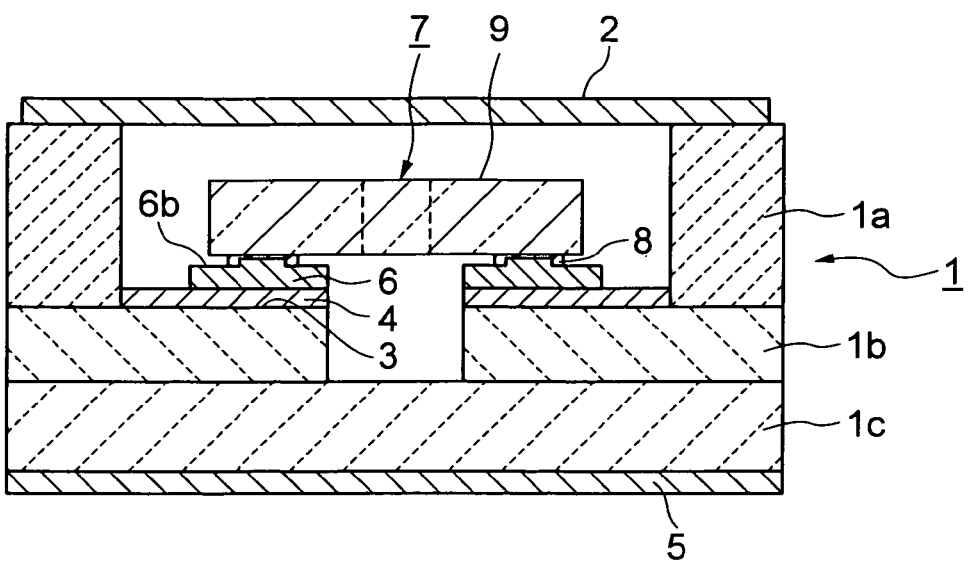
FIG. 3B is a cross-section view of a tuning-fork type piezoelectric unit which has a metal bump with an end face having a stair shape.

FIG. 3A and FIG. 3B are diagrams describing a second embodiment of a tuning-fork type piezoelectric unit of the present invention, wherein FIG. 3A is a cross-section view of a tuning-fork type piezoelectric unit which has a metal bump 6 with an end face comprising an inclined face, and FIG. 3B is a cross-section view of a tuning-fork type piezoelectric unit which has a metal bump 6 with an end face comprising a stair shape. Descriptions of parts the same as for the previous embodiment are abbreviated or omitted. That is to say, in the first embodiment, both end sides 6*b* of the metal bump 6 (upper surface flat part 6*a*) are made an arcuate shape curved surface, however in the second embodiment, for example in FIG. 3A, both end sides 6*b* are a straight inclined face, or in FIG. 3B, a stair like step is provided.

Even with this shape of the metal bump 6, the upper surface flat part 6*a* becomes the close contact surface area and governs the vibration characteristics and the bond strength, and the inclined face and the lower step of the stair like shape on both end sides 6*b* supplement the bond strength. Consequently, as with the first embodiment, the bond strength is maintained so that the frequency change for before and after a drop impact test is suppressed.

Third Embodiment

Figure 4:
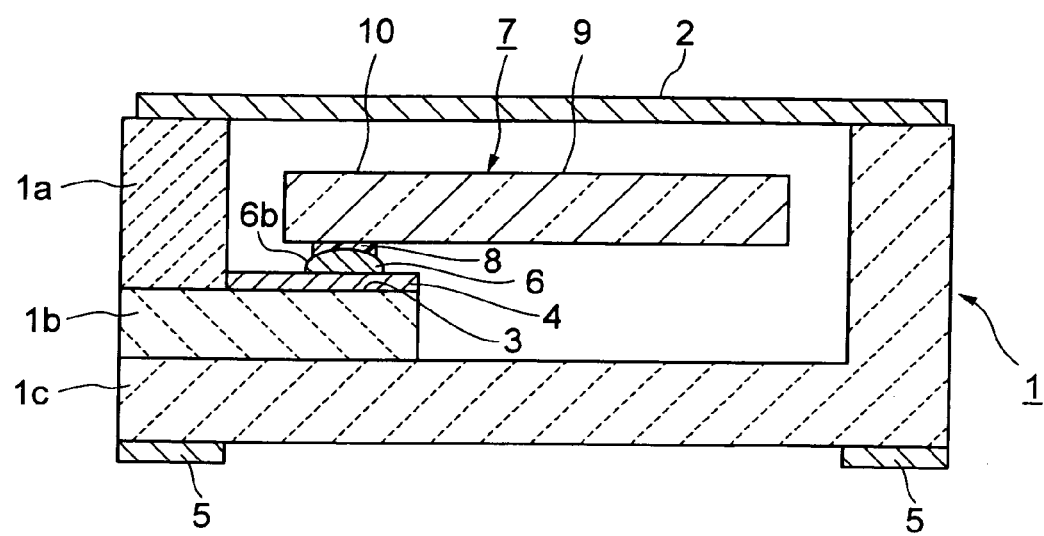
FIG. 4 is a cross-section in a lengthwise direction of a tuning-fork type piezoelectric unit showing a shape of a metal bump, for describing an embodiment of a tuning-fork type piezoelectric unit of the present invention.
Figure 5A:
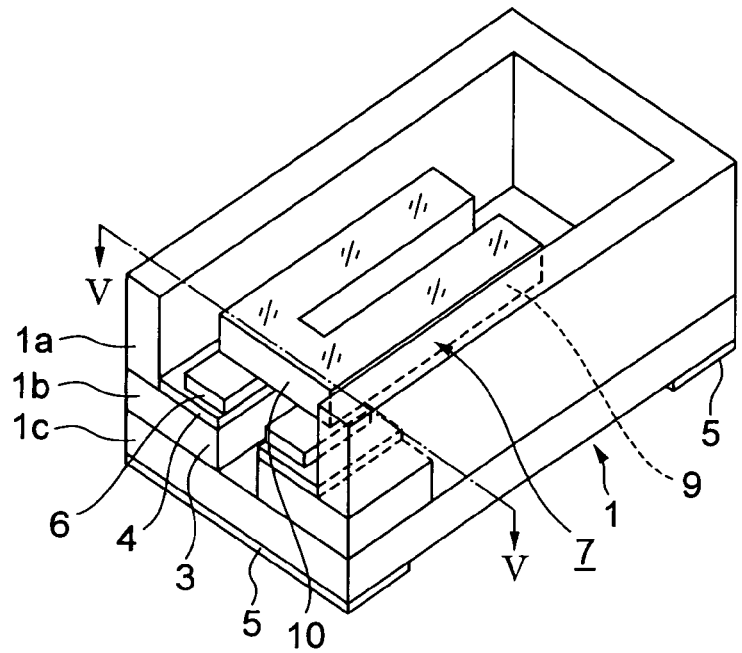
FIG. 5A is a perspective view where a part of a tuning-fork type piezoelectric unit with a tuning-fork type piezoelectric element bonded thereto is opened showing the interior (a cover is removed)
Figure 5B:
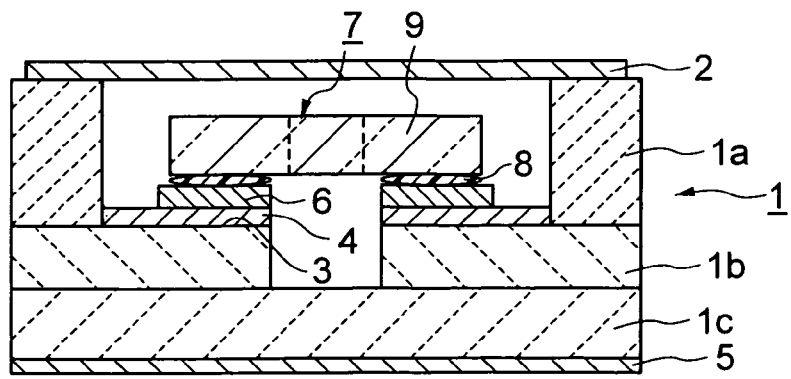
FIG. 5B is a cross-section view of a tuning-fork type piezoelectric unit.

FIG. 4 is a drawing describing a third embodiment of a tuning-fork type piezoelectric unit of the present invention, being a longitudinal section of a tuning-fork type piezoelectric unit in a lengthwise direction of a tuning-fork arm 9. In the first and second embodiments, an inclined face or a step was provided in the widthwise direction of the metal bump 6, however in the third embodiment, an inclined face or a stair like step is provided in the lengthwise direction. In this case also, similarly to the previous description, the bond strength is maintained, and the frequency change for before and after a drop impact test can be suppressed.

Other Embodiments

In the above embodiments, an inclined face or a step surface is provided on both end sides 6*b* in the widthwise or the lengthwise direction of the metal bump. However, these may be provided for example on the overall outer periphery of the metal bump 6. As necessary, the inclined face or the step surface may be provided on at least one end side of the metal bump that faces the tuning-fork base 10. Furthermore, the metal bump 6 is a rectangle shape, however the configuration is not limited to this and this may be a circle or an oval shape. If the upper surface flat part 6*a* is smaller than the lower surface then a similar effect is demonstrated. Furthermore, the tuning-fork type piezoelectric piece 7 is described as a representative example, however even in the case where a groove that enhances the field effect is provided on both principal planes of the pair of tuning-fork arms 9, and a metal film for adjusting the frequency is provided on the tip end side of the tuning-fork arms 9, this can be similarly applied. The present invention relates to suppressing particularly the frequency change for before and after a drop impact test, and to the shape of the metal bump 6 to maintain the contact strength. In particular, since the width dimension of the upper surface flat part 6*a* of the metal bump 6 that determines the close contact surface area with the tuning-fork base 10 is limited, then modifications aimed at making the surface area of the upper surface flat part 6*a* of the metal bump 6 less than the lower surface area (overall width dimension of the metal bump 6) where the metal bump 6 contacts with the electrode pad 4, are included in the technical scope of the present invention.

What is claimed is:

1. A tuning-fork type piezoelectric unit comprising: a container main body with a concave shape; an electrode pad which is provided inside a concavity of said container main body; a metal bump which is provided on said electrode pad; a tuning-fork type piezoelectric piece in which one principal plane of a tuning-fork base with a pair of tuning-fork arms extended therefrom is bonded to said metal bump by means of a conductive adhesive; and a cover which is joined to an opening end face of said container main body to hermetically seal said tuning-fork type piezoelectric piece, wherein a surface area of an upper surface flat part of said metal bump is smaller than a bottom surface area of said metal bump, wherein said metal bump has a widthwise cross-sectional profile that is substantially constant in a lengthwise direction of said metal bump, and a curved surface on both sides wherein said metal bump is dimensioned and configured such that frequency changes for said tuning-fork type piezoelectric piece are suppressed when said tuning-fork type piezoelectric unit is caused to be dropped.

2. A tuning-fork type piezoelectric unit according to claim 1, wherein said metal bump has a widthwise inclined face or a stair shape on at least one end side.

3. A tuning-fork type piezoelectric unit according to claim 1, wherein said metal bump has an inclined face or a stair shape on both end sides in the width direction of said tuning-fork type piezoelectric piece.

4. A tuning-fork type piezoelectric unit according to claim 1, wherein a length of an upper surface flat part of said metal bump in a width direction of said tuning-fork type piezoelectric piece is about 20% to about 43% of a length of a bottom surface of said metal bump.

5. A tuning fork type piezoelectric unit according to claim 1, wherein said surface area of said upper surface flat part of said bump has a width dimension of approximately 100 μm.

6. A tuning fork type piezoelectric unit according to claim 5, wherein said curved side surface has a width dimension of approximately 60 μm.

7. A tuning fork type piezoelectric unit according to claim 1, wherein the width of said upper surface flat part of said bump is between 20% to 90% of the width dimension of said bottom surface of said bump.

* * * * *